(12) United States Patent
Ohara

(10) Patent No.: US 10,566,408 B2
(45) Date of Patent: *Feb. 18, 2020

(54) DISPLAY DEVICE

(71) Applicant: Japan Display Inc., Tokyo (JP)

(72) Inventor: Hiroki Ohara, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/106,265

(22) Filed: Aug. 21, 2018

(65) Prior Publication Data

US 2018/0358426 A1   Dec. 13, 2018

Related U.S. Application Data

(63) Continuation of application No. 15/351,617, filed on Nov. 15, 2016, now Pat. No. 10,090,372.

(30) Foreign Application Priority Data

Feb. 25, 2016 (JP) .................................. 2016-034244

(51) Int. Cl.
*H01L 27/32* (2006.01)
*H01L 51/00* (2006.01)
*H01L 51/52* (2006.01)

(52) U.S. Cl.
CPC ...... *H01L 27/3279* (2013.01); *H01L 51/0097* (2013.01); *H01L 51/5209* (2013.01); *H01L 51/5225* (2013.01); *H01L 2251/305* (2013.01); *H01L 2251/5338* (2013.01); *Y02E 10/549* (2013.01)

(58) Field of Classification Search
CPC combination set(s) only.
See application file for complete search history.

(56) References Cited

U.S. PATENT DOCUMENTS

| 10,090,372 B2 * | 10/2018 | Ohara ............... H01L 27/3279 |
| 2005/0168490 A1 | 8/2005 | Takahara |
| 2008/0303755 A1 | 12/2008 | Oh |
| 2009/0051640 A1 | 2/2009 | Tanaka et al. |
| 2014/0077204 A1 | 3/2014 | Saito et al. |

(Continued)

FOREIGN PATENT DOCUMENTS

| JP | 2008-276226 A | 11/2008 |
| JP | 2008-304880 A | 12/2008 |

(Continued)

OTHER PUBLICATIONS

Japanese Office Action dated Jun. 4, 2019 for the corresponding Japanese application No. 2016-034244, with partial English translation.

Primary Examiner — Fernando L Toledo
Assistant Examiner — Valerie N Newton
(74) Attorney, Agent, or Firm — Michael Best & Friedrich LLP

(57) ABSTRACT

Provided is a highly reliable display device that does not easily cause a wiring or an interlayer insulating layer to be cracked when being folded. A display device includes a flexible substrate; a plurality of pixels arrayed on the substrate; and a wiring, provided on the substrate, transmitting a signal to drive the plurality of pixels. The wiring includes a first conductive layer having an opening pattern at least in a partial area thereof.

11 Claims, 23 Drawing Sheets

(56) References Cited

U.S. PATENT DOCUMENTS

| | | |
|---|---|---|
| 2014/0092353 A1 | 4/2014 | Matsushima |
| 2014/0254111 A1 | 9/2014 | Yamazaki et al. |
| 2015/0323842 A1 | 11/2015 | Matsushima |
| 2016/0103358 A1 | 4/2016 | Tanaka |
| 2016/0343953 A1 | 11/2016 | Kuwabara et al. |

FOREIGN PATENT DOCUMENTS

| | | |
|---|---|---|
| JP | 2009-048007 A | 3/2009 |
| JP | 2010-020209 A | 1/2010 |
| JP | 2014-059531 A | 4/2014 |
| JP | 2014-197181 A | 10/2014 |

* cited by examiner

DISPLAY DEVICE

CROSS REFERENCE TO RELATED APPLICATIONS

This application is a continuation of U.S. patent application Ser. No. 15/351,617 filed on Nov. 15, 2016. Further, this application is based upon and claims the benefit of priority from the prior Japanese Patent Application No. 2016-034244 filed on Feb. 25, 2016, the entire contents of which are incorporated herein by reference.

FIELD

The present invention relates to a display device, and specifically to a structure of wiring of a display device.

BACKGROUND

An organic electroluminescence (hereinafter, referred to as "organic EL") display device includes a light-emitting element in each of a plurality of pixels, and displays an image by controlling light emission in each of the pixels individually. The light-emitting element includes a pair of electrodes, one of which is an anode electrode and the other of which is a cathode electrode, and a layer containing an organic EL material (hereinafter, referred to also as a "light-emitting layer") held between the pair of electrodes. When electrons are injected into the light-emitting layer from the cathode electrode and holes are injected into the light-emitting layer from the anode electrode, the electrons and the holes are recombined. Light emitting molecules in the light-emitting layer are excited by extra energy released by the recombination, and then are deexcited. Thus, the light-emitting elements emit light.

In such an organic EL display device, the anode electrode in each of the light-emitting elements is provided as a pixel electrode corresponding to the respective pixel, and the cathode electrode is provided as a common electrode corresponding to the plurality of pixels and supplied with a common potential. The organic EL display device applies a potential of the pixel electrode in each pixel with respect to the potential of the common electrode, and thus controls the light emission of each pixel.

Recently, flexible display devices including a foldable display region have been actively developed. In such a flexible display device, lines are formed in a display region. There is a problem that when the display device is folded, a stress is concentrated on the lines, and the lines are easily disconnected. A gate insulating layer included in a transistor, an interlayer insulating layer covering the transistor, and the like are easily cracked when the display device is folded and thus easily decline the reliability.

Japanese Laid-Open Patent Publication No. 2010-020209 discloses a liquid crystal display device including an array substrate and a color filter substrate that are located such that surfaces thereof face each other and are bonded together by a sealing member. A space between the array substrate and the color filter substrate is filled with a liquid crystal material. On the surface of the array substrate, a common line is formed in a peripheral region around a display region. The common line has light transmission holes in a mesh pattern, and the sealing member is located so as to overlap the light transmission holes located in the mesh pattern as seen in a plan view.

SUMMARY

An embodiment according to the present invention is directed to a display device including a flexible substrate; a plurality of pixels arrayed on the substrate; and a wiring, provided on the substrate, transmitting a signal to drive the plurality of pixels. The wiring includes a first conductive layer having an opening pattern at least in a partial area thereof.

An embodiment according to the present invention is directed to a display device including a flexible substrate; and a plurality of pixels arrayed in a matrix on the substrate. Each of the plurality of pixels includes a light-emitting element having a stack structure including a pixel electrode provided in the each of the plurality of pixels, a light-emitting layer and a common electrode commonly provided for the plurality of pixels; and the pixel electrode includes a first conductive layer having an opening pattern.

DESCRIPTION OF EMBODIMENTS

Figure 1:
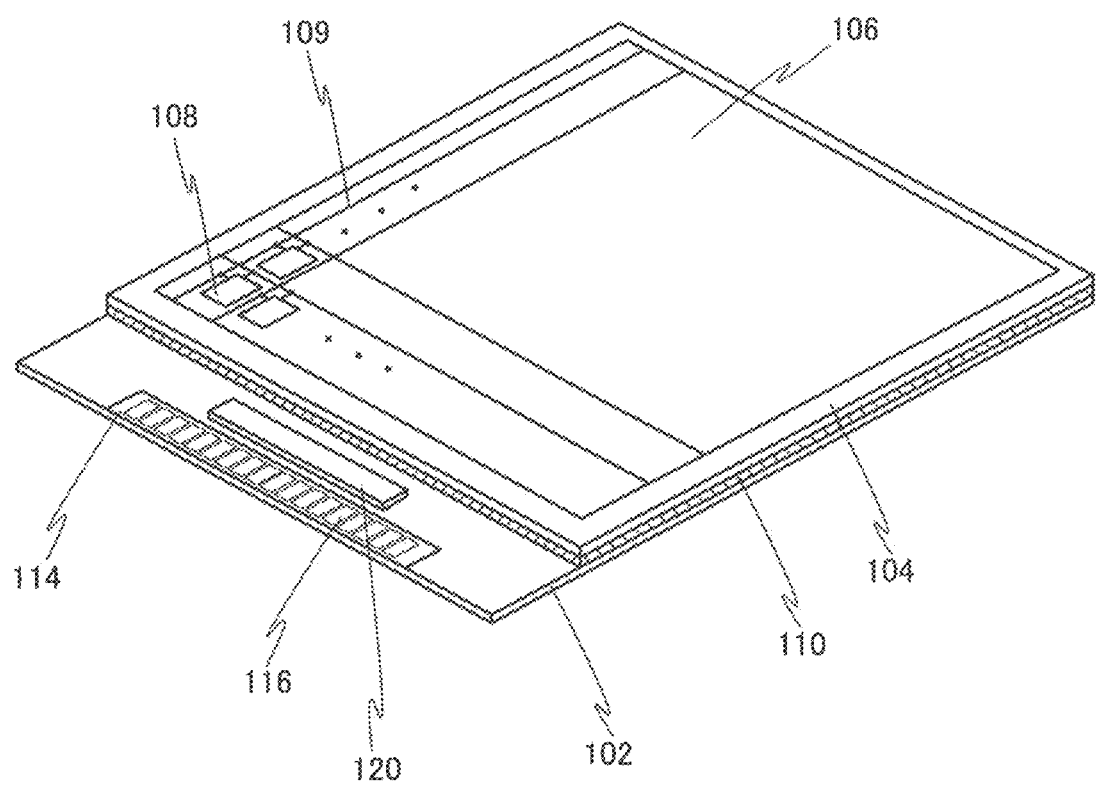
FIG. 1 is a perspective view showing a structure of a display device in an embodiment according to the present invention.

Hereinafter, embodiments of the present invention will be described with reference to the drawings and the like. The present invention may be carried out in various other embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely examples and do not limit the interpretations of the present invention in any way. In the specification and the drawings, components that are substantially the same as those described or shown previously bear the identical reference signs thereto, and detailed descriptions thereof may be omitted when necessary.

In this specification, an expression that a component or area is "on" another component or area encompasses a case where such a component or area is in contact with another component or area and also a case where such a component or area is above or below the another component or area, namely, a case where still another component or area is provided between such a component or area and the another component or area, unless otherwise specified.

<Embodiment 1>

With reference to the figures, a schematic structure of a display device 100 in this embodiment, a circuit configuration thereof, and a structure of wiring included in the display device 100 will be described.

[Schematic Structure]

FIG. 1 is a perspective view schematically showing a structure of the display device 100 in this embodiment. The display device 100 in this embodiment includes a first substrate 102, a second substrate 104, a plurality of pixels 108, various wiring 109, and a plurality of connection terminals 116.

The first substrate 102 is flexible. The flexible first substrate 102 is formed of a resin material. A preferable resin material is a polymer including an imide bond in a repeat unit, for example, polyimide. Specifically, the first substrate 102 is formed of a sheet-type film of polyimide. On the first substrate 102, a display region 106 and a terminal region 114 are provided.

The plurality of pixels 108 is arrayed in the display region 106 on the first substrate 102. The plurality of pixels 108 each include a pixel circuit including at least a selection transistor, a driving transistor and a light-emitting element.

The various wiring 109 are provided on the first substrate 102. As described below in detail, the various wiring 109 transmit a signal to drive the plurality of pixels 108. As described below in detail, the various wiring 109 include at least a scanning signal line and a video signal line.

The second substrate 104 is flexible. The flexible second substrate 104 may be formed of substantially the same material as that of the first substrate 102. The second substrate 104 is provided on a top surface of the display region 106 so as to face the first substrate 102. The second substrate 104 is secured to the first substrate 102 by a sealing member 110 enclosing the display region 106. The display region 106 located on the first substrate 102 is sealed by the second substrate 104 and the sealing member 110 so as not to be exposed to the outside air. Such a sealing structure suppresses the light-emitting elements included in the pixels 108 from being deteriorated.

The plurality of connection terminals 116 are located in the terminal region 114. The terminal region 114 is located along one end of the first substrate 102 and outer to the second substrate 104. At each of the connection terminals 116, a wiring board 150 that connects a device outputting a video signal, a power supply or the like with the display device 100 is provided. A contact of each of the connection terminals 116 with the wiring board 150 is exposed outside.

[Circuit Configuration]

Figure 2:
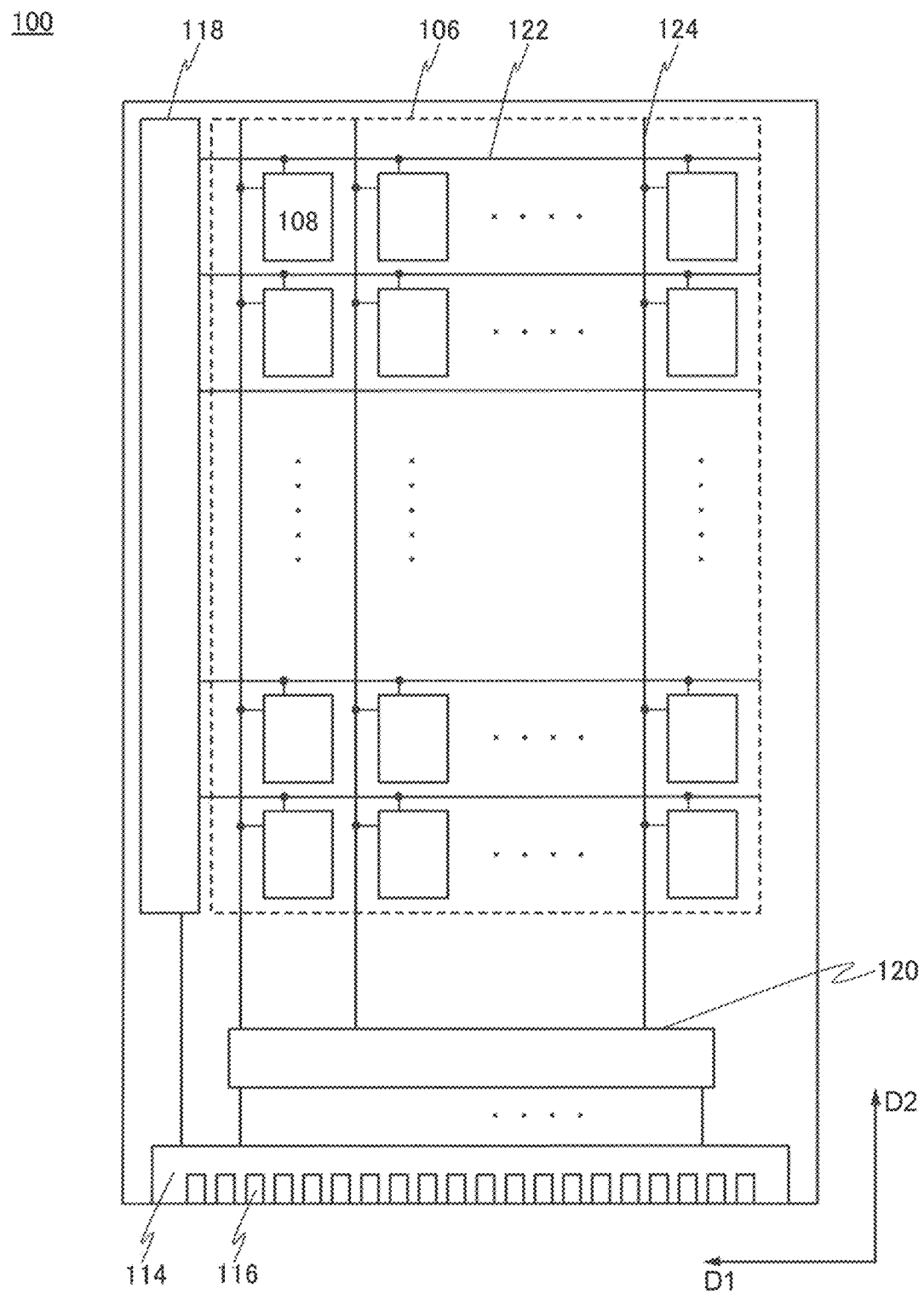
FIG. 2 is a plan view showing a circuit configuration of the display device in the embodiment according to the present invention.

FIG. 2 is a plan view showing a circuit configuration of the display device 100 in this embodiment. In the display device 100, a signal driving the display device 100 is input from each of the plurality of connection terminals 116 to a scanning signal line driving circuit 118 and a video signal line driving circuit 120. The scanning signal line driving circuit 118 outputs a signal to a plurality of scanning signal lines 122, and the video signal line driving circuit 120 outputs a signal to a plurality of video signal lines 124. The plurality of scanning signal lines 122 and the plurality of video signal lines 124 each transmit such a signal to the plurality of pixels 108.

The plurality of pixels 108 are arrayed in a matrix, namely, in a row direction and a column direction. The pixels 108 are provided in an arbitrary number. For example, m number of pixels 108 may be arrayed in the row direction (D1 direction) whereas n number of pixels 108 may be arrayed in the column direction (D2 direction) (m and n are each an integer). In the display region 106, the plurality of scanning signal lines 122 extend in the row direction and arrayed in the column direction. The plurality of video signal lines 124 extend in the column direction and arrayed in the row direction.

In FIG. 2, an axis of coordinates is shown outside the display device 100. In actuality, however, the axis of coordinates is fixed in the display device 100.

[Structure of Wiring]

Figure 3A:
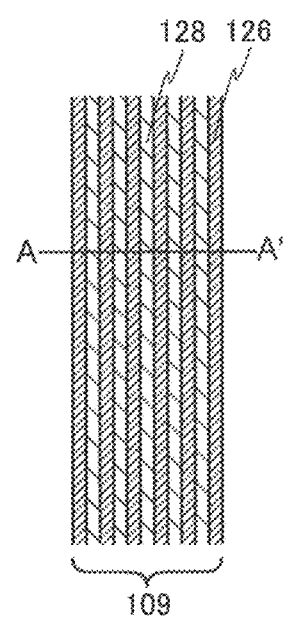
FIG. 3A is a plan view showing a structure of a wiring included in the display device in the embodiment according to the present invention.
Figure 3B:
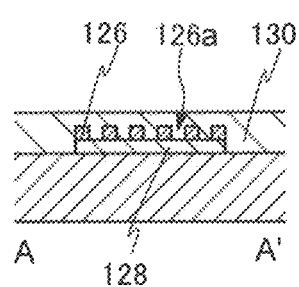
FIG. 3B is a cross-sectional view showing the structure of the wiring included in the display device in the embodiment according to the present invention, taken along wiring A-A' in FIG. 3A.
Figure 4A:
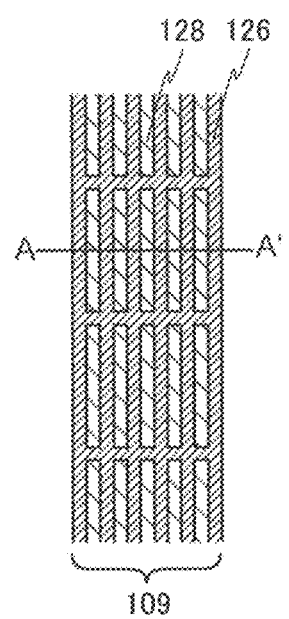
FIG. 4A is a plan view showing a structure of a wiring included in the display device in the embodiment according to the present invention.
Figure 4B:
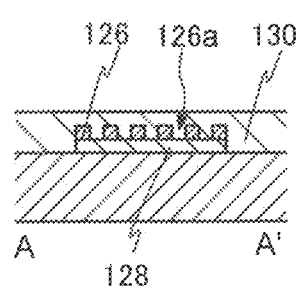
FIG. 4B is a cross-sectional view showing the structure of the wiring included in the display device in the embodiment according to the present invention, taken along line A-A' in FIG. 4A.
Figure 5A:
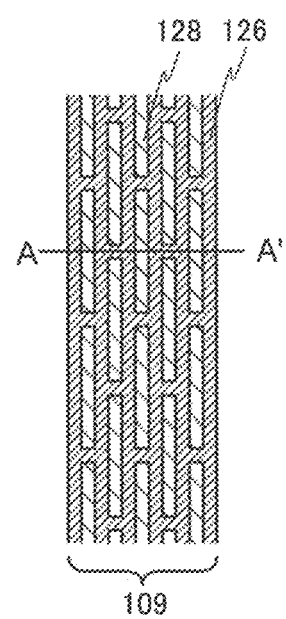
FIG. 5A is a plan view showing a structure of a wiring included in the display device in the embodiment according to the present invention.
Figure 5B:
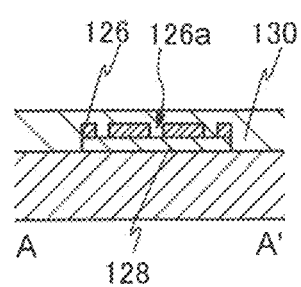
FIG. 5B is a cross-sectional view showing the structure of the wiring included in the display device in the embodiment according to the present invention, taken along line A-A' in FIG. 5A.
Figure 6A:
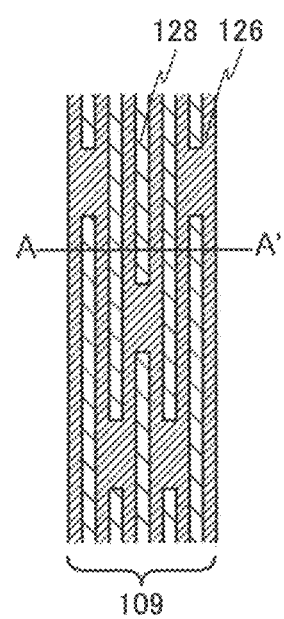
FIG. 6A is a plan view showing a structure of a wiring included in the display device in the embodiment according to the present invention.
Figure 6B:
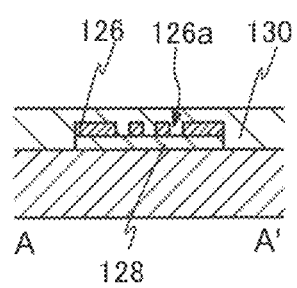
FIG. 6B is a cross-sectional view showing the structure of the wiring included in the display device in the embodiment according to the present invention, taken along line A-A' in FIG. 6A.
Figure 7A:
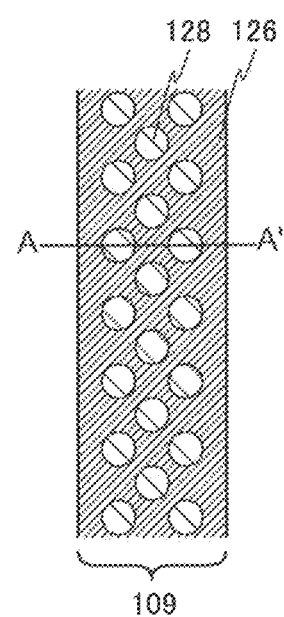
FIG. 7A is a plan view showing a structure of a wiring included in the display device in the embodiment according to the present invention.
Figure 7B:
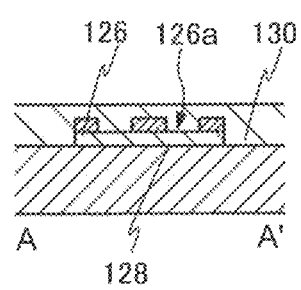
FIG. 7B is a cross-sectional view showing the structure of the wiring included in the display device in the embodiment according to the present invention, taken along line A-A' in FIG. 7A.

A structure of each of the various wiring 109 included in the display device 100 in this embodiment will be described. FIG. 3A and FIG. 3B are respectively a plan view and a cross-sectional view, taken along line A-A' in FIG. 3A, showing an example of structure of the wiring 109 included in the display device 100 in this embodiment. FIG. 4A and FIG. 4B are respectively a plan view and a cross-sectional view, taken along line A-A' in FIG. 4A, showing another example of structure of the wiring 109 included in the display device 100 in this embodiment. FIG. 5A and FIG. 5B are respectively a plan view and a cross-sectional view, taken along line A-A' in FIG. 5A, showing still another example of structure of the wiring 109 included in the display device 100 in this embodiment. FIG. 6A and FIG. 6B are respectively a plan view and a cross-sectional view, taken along line A-A' in FIG. 6A, showing still another example of structure of the wiring 109 included in the display device 100 in this embodiment. FIG. 7A and FIG. 7B are respectively a plan view and a cross-sectional view, taken along line A-A' in FIG. 7A, showing still another example of structure of the wiring 109 included in the display device 100 in this embodiment.

The structures of the wiring 109 shown in FIG. 3A through FIG. 7B are merely examples, and the structure of the wiring 109 is not limited to any of these. With reference to FIG. 3A through FIG. 7B, five opening patterns are shown. The opening pattern applicable to the wiring 109 included in the display device 100 in this embodiment is not limited to any of these.

The wiring 109 included in the display device 100 in this embodiment includes two conductive layers, specifically, a first conductive layer 126 and a second conductive layer 128, which are located sequentially in this order from the top side. The wiring 109 is covered with an insulating layer 130. The insulating layer 130 has a function of, for example, an interlayer insulating layer or a protective layer.

The first conductive layer 126 has an opening pattern 126a at least in a partial area thereof. The "partial area" is a folded area.

The "partial area" may be a partial area on the first substrate 102. In this case, the first conductive layer 126 has the opening pattern 126a in an area where the partial area and the wiring 109 overlap each other.

Alternatively, the "partial area" may be an area extending at least in a specific direction in the wiring 109, which includes the area extending in the specific direction.

The wiring 109 shown in FIG. 3A and FIG. 3B includes a plurality of openings. The plurality of openings each extend like a groove in a direction in which the wiring 109 extends. The plurality of openings are located periodically in a width direction of the wiring 109. In this example, the first conductive layer 126 includes five groove-like openings. In other words, the wiring 109 is divided into a plurality of wiring portions separated from each other. In this example, the wiring 109 is divided into six wiring portions separated from each other and having substantially the same width as each other. Namely, the opening pattern 126a is a striped pattern formed in the first conductive layer 126.

Such a structure improves the durability against folding in the width direction of the wiring 109. In addition, even if one of the plurality of divided wiring portions is disconnected, the wiring 109 is not entirely disconnected because of the other divided wiring portions.

The wiring 109 shown in FIG. 4A and FIG. 4B includes a plurality of openings. The plurality of openings each have a rectangular shape having a longer side in the direction in which the wiring 109 extends. The plurality of openings are located periodically in the direction in which the wiring 109 extends. The plurality of openings located periodically in the direction in which the wiring 109 extends are further located periodically in the width direction of the wiring 109. The openings adjacent to each other in the direction in which the wiring 109 extends and in the width direction of the wiring 109 have a constant gap therebetween. In other words, the wiring 109 shown in FIG. 4A and FIG. 4B is divided into a plurality of wiring portions located in a lattice pattern. Namely, the opening pattern 126a is a lattice pattern formed in the first conductive layer 126.

Such a structure improves the durability against folding in the direction in which the wiring 109 extends and in the width direction of the wiring 109. In addition, even if one of the plurality of divided wiring portions is disconnected, the wiring 109 is not entirely disconnected because of the other divided wiring portions. Thus, the resistance of the wiring 109 is not significantly raised.

The wiring 109 shown in FIG. 5A and FIG. 5B includes a plurality of openings. The plurality of openings each have a rectangular shape having a longer side in the direction in which the wiring 109 extends. The plurality of openings are located periodically in the direction in which the wiring 109 extends. The plurality of openings located periodically in the direction in which the wiring 109 extends are further located in the width direction of the wiring 109 as being shifted from each other in an alternate pattern. The openings adjacent to each other in the direction in which the wiring 109 extends and in the width direction of the wiring 109 have a constant gap therebetween.

Such a structure improves the durability against folding in the direction in which the wiring 109 extends and in the width direction of the wiring 109. In addition, even if one of the plurality of divided wiring portions is disconnected, the wiring 109 is not entirely disconnected because of the other divided wiring portions. Thus, the resistance of the wiring 109 is not significantly raised.

The wiring 109 shown in FIG. 6A and FIG. 6B includes a plurality of openings. The plurality of openings each have a rectangular shape having a longer side in the direction in which the wiring 109 extends. The plurality of openings are located periodically in the direction in which the wiring 109 extends. The plurality of openings located periodically in the direction in which the wiring 109 extends are further located in the width direction of the wiring 109 as being shifted from each other in a certain regular pattern. The gap between the openings adjacent to each other in the direction in which the wiring 109 extends is larger than the gap between the openings adjacent to each other in the width direction of the wiring 109.

Such a structure improves the durability against folding in the direction in which the wiring 109 extends and in the width direction of the wiring 109 while suppressing the resistance of the wiring 109 from being raised. In addition, even if one of the plurality of divided wiring portions is disconnected, the wiring 109 is not entirely disconnected because of the other divided wiring portions. Thus, the resistance of the wiring 109 is not significantly raised.

The wiring 109 shown in FIG. 7A and FIG. 7B includes a plurality of openings. The plurality of openings each have a circular shape. The plurality of openings are located periodically in the direction in which the wiring 109 extends. The plurality of openings located periodically in the direction in which the wiring 109 extends are further located in the width direction of the wiring 109 as being shifted from each other in an alternate pattern.

In this embodiment, the first conductive layer 126 includes a transparent conductive layer. The transparent conductive layer contains a conductive oxide. A usable conductive oxide may be, for example, ITO (tin oxide-containing indium oxide), IZO (oxide indium-zinc oxide) or the like. The wiring 109 formed of such a conductive oxide is more easily cracked than a wiring formed of a metal material. Provision of the above-described opening pattern 126a in the wiring 109 formed of the conductive oxide improves the durability of the wiring 109 against cracking.

A preferable conductive oxide is amorphous, not crystalline. An amorphous conductive oxide improves the durability against cracking and against rise in the resistance at the time of folding.

The conductive oxide may contain an element having a relatively large s orbital. Examples of the element having a relatively large s orbital include Al, Ag, Ti, Cu, Mo, Ta, W, Pt, Au and the like.

Use of such an element increases the overlapping of s orbitals of the element. In the case where the s orbitals are isotropic, the s orbitals of the element are difficult to be separated from each other at the time of folding, which improves the durability against cracking and against rise in the resistance.

The second conductive layer 128 is located below the first conductive layer 126. In this embodiment, the second conductive layer 128 may be formed of a conductive metal material. A usable conductive metal material may be, for example, Cu (copper).

The insulating layer 130 may be formed of an inorganic insulating material or an organic insulating material.

Examples of the inorganic insulating material usable for the insulating layer 130 include silicon oxide (SiOx), silicon nitride (SiNx), silicon oxide nitride (SiOxNy), silicon nitride oxide (SiNxOy), aluminum oxide (AlOx), aluminum nitride (AlNx), aluminum oxide nitride (AlOxNy), aluminum nitride oxide (AlNxOy), and the like (x and y are each an arbitrary numeral). The insulating layer 130 may include a stack of films formed of such materials. The insulating layer 130 may be formed by plasma CVD or sputtering.

The first conductive layer 126 below the insulating layer 130 has the opening pattern 126a. Therefore, the insulating layer 130 is patterned in a self-aligned manner. This improves the durability of the insulating layer 130 against cracking at the time of folding.

Examples of structure of the wiring 109 included in the display device 100 in this embodiment are described above. The display device 100 having such a structure suppresses the resistance of the wiring 109 from being raised while having improved durability against folding in the direction in which the wiring 109 extends and also in the width direction of the wiring 109.

<Embodiment 2>

With reference to the figures, a structure of a display device 200 in this embodiment and a structure of the wiring 109 included in the display device 200 will be described. Unlike the display device 100 in embodiment 1, the display device 200 has a folding direction defined. Except for this point, the display device 200 is substantially the same as the display device 100, and detailed descriptions thereof will be omitted.

Figure 8:
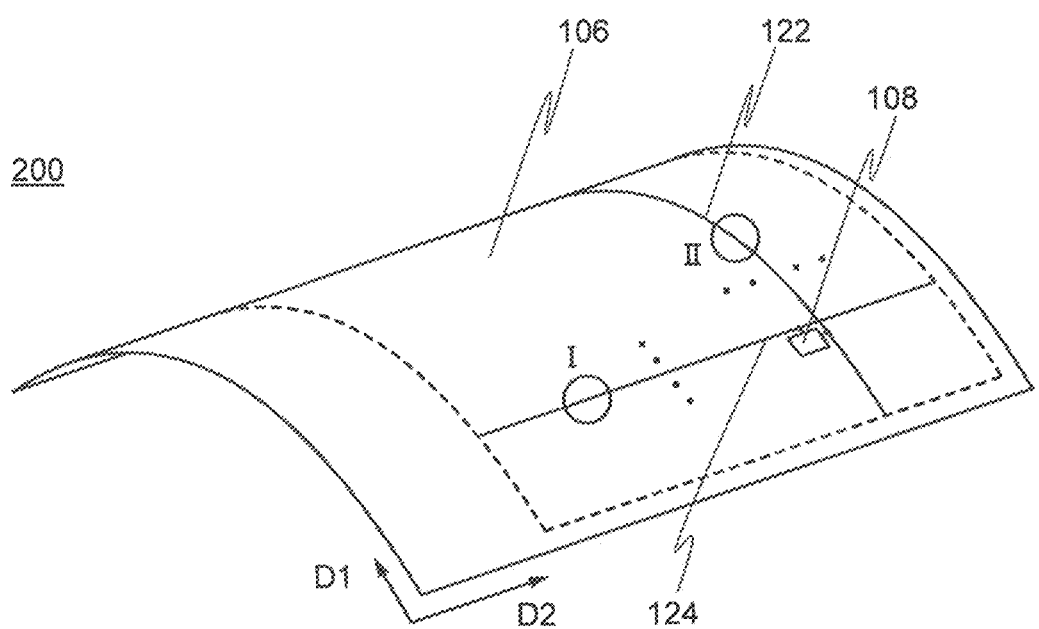
FIG. 8 is a perspective view showing a structure of a display device in an embodiment according to the present invention in a folded state.
Figure 9A:
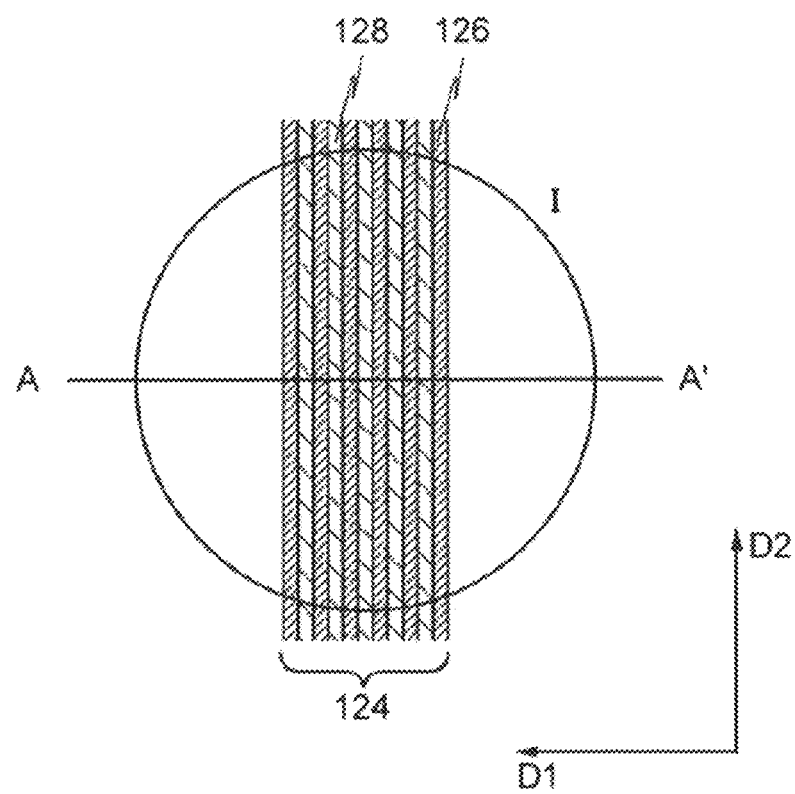
FIG. 9A is a plan view showing a structure of a wiring included in the display device in the embodiment according to the present invention.
Figure 9B:
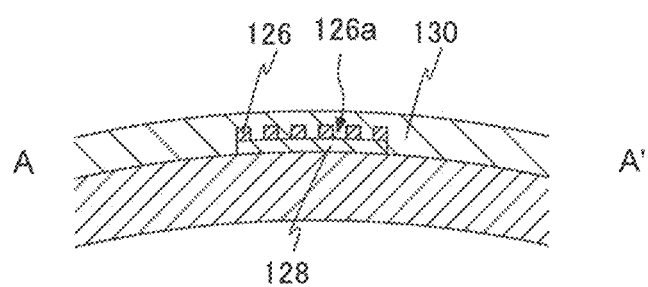
FIG. 9B is a cross-sectional view showing the structure of the wiring included in the display device in the embodiment according to the present invention, taken along line A-A' in FIG. 9A.
Figure 10A:
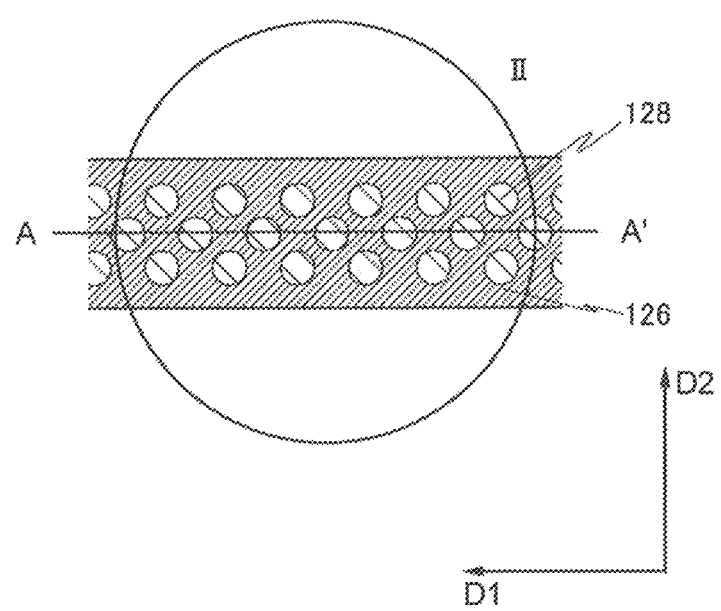
FIG. 10A is a plan view showing a structure of a wiring included in the display device in the embodiment according to the present invention.
Figure 10B:
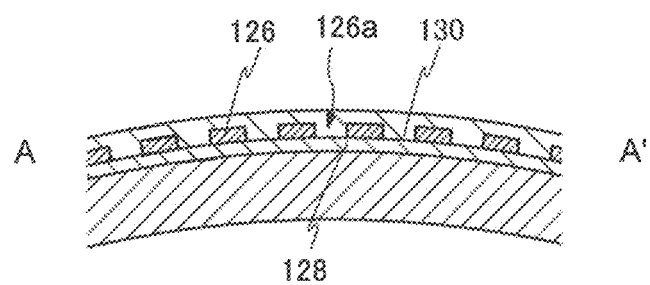
FIG. 10B is a cross-sectional view showing the structure of the wiring included in the display device in the embodiment according to the present invention, taken along line A-A' in FIG. 10A.

FIG. 8 is a perspective view showing a structure of the display device 200 in this embodiment in a folded state. FIG. 9A and FIG. 9B are respectively a plan view and a cross-sectional view, taken along line A-A' in FIG. 9A, showing an example of structure of the wiring 109 included in the display device 200 in this embodiment. FIG. 9A and FIG. 9B show portion I shown in FIG. 8. FIG. 10A and FIG. 10B are respectively a plan view and a cross-sectional view, taken along line A-A' in FIG. 10A, showing another example of structure of the wiring 109 included in the display device 200 in this embodiment. FIG. 10A and FIG. 10B show portion II shown in FIG. 8.

Unlike the display device 100 in embodiment 1, the display device 200 has a folding direction defined. The display device 200 is defined as being folded in the D1 direction.

The "folding direction" is a direction perpendicular to a direction of a straight line, on a curved surface, the curvature of which is not different between before and after the folding. In this embodiment, the curvature of a straight line extending in the D2 direction is not different between before and after the folding. Therefore, the "folding direction" is the D1 direction perpendicular to the D2 direction.

As shown in FIG. 9A and FIG. 9B, the wiring 109 extending in the D2 direction perpendicular to the folding direction has substantially the same opening pattern as that of the wiring 109 shown in FIG. 3A and FIG. 3B. The wiring 109 extending in the D2 direction is, for example, the video signal line 124.

As shown in FIG. 10A and FIG. 10B, the wiring 109 extending in the D1 direction, which is the folding direction, has substantially the same opening pattern as that of the wiring 109 shown in FIG. 7A and FIG. 7B. The wiring 109 extending in the D1 direction is, for example, the scanning signal line 122.

The display device 200 having such a structure does not easily cause the wiring 109 or the insulating layer 130 to be cracked even when being folded in the defined folding direction and thus is highly reliable.

<Embodiment 3>

With reference to the figures, a structure of a display device 300 in this embodiment and a structure of the wiring 109 included in the display device 300 will be described. Unlike the display device 100 in embodiment 1, the display device 300 has a defined folding area 132. Except for this point, the display device 300 is substantially the same as the display device 100, and detailed descriptions thereof will be omitted.

Figure 11:
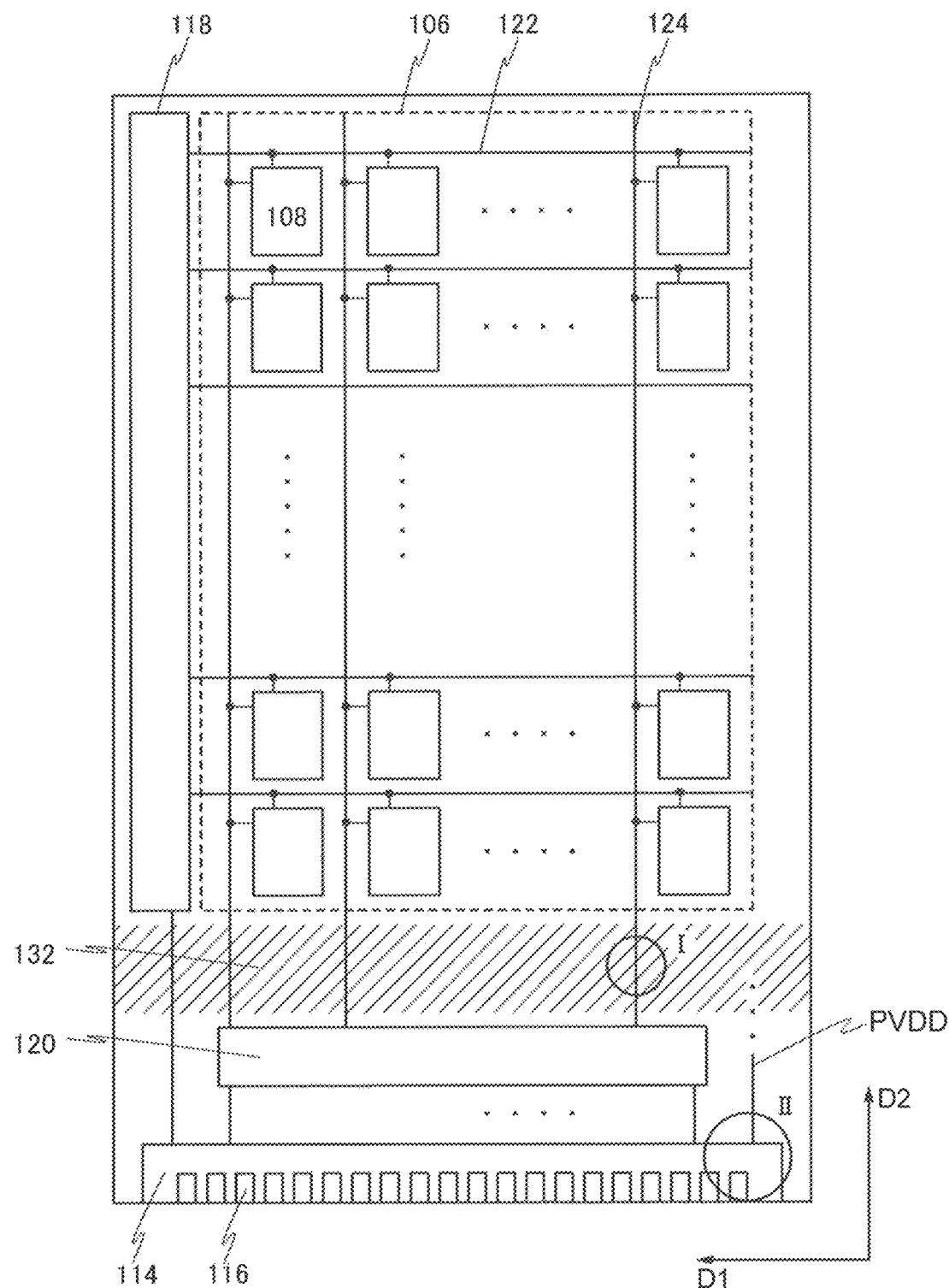
FIG. 11 is a plan view showing a circuit configuration of a display device in an embodiment according to the present invention.
Figure 12:
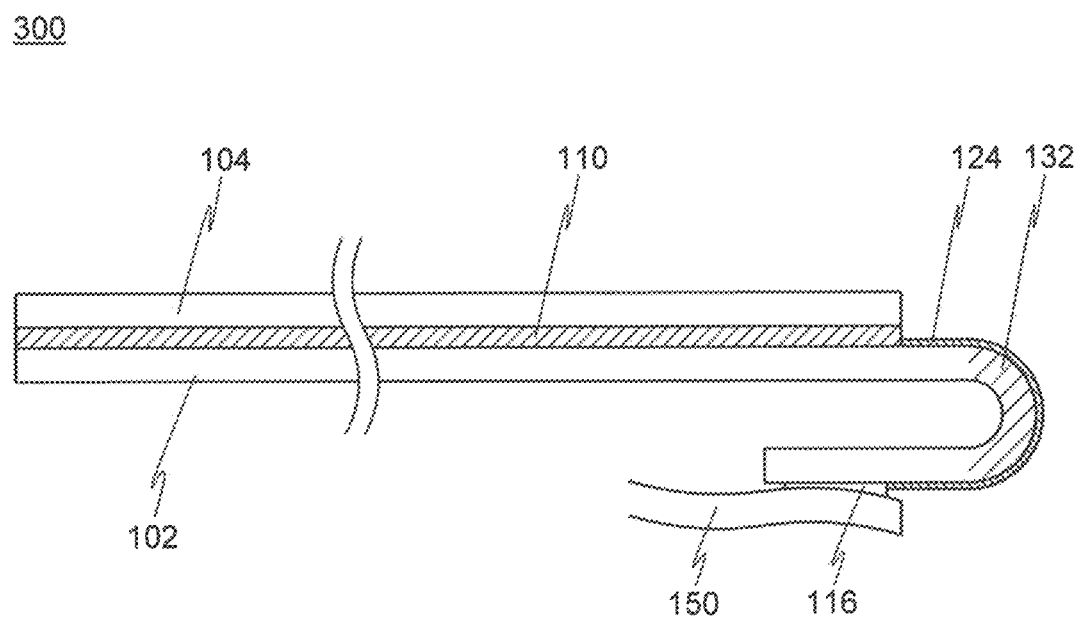
FIG. 12 is a cross-sectional view showing a structure of the display device in the embodiment according to the present invention in a folded state.
Figure 13A:
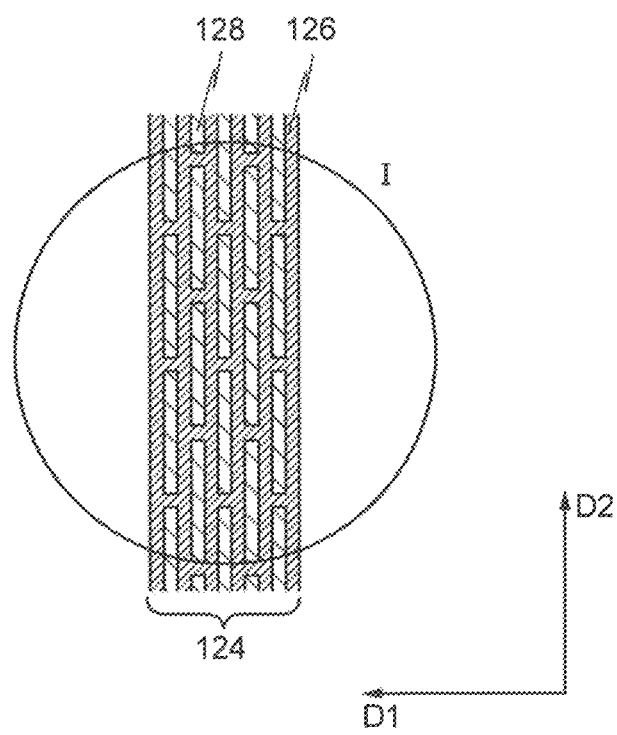
FIG. 13A is a plan view showing a structure of a wiring included in the display device in the embodiment according to the present invention.
Figure 13B:
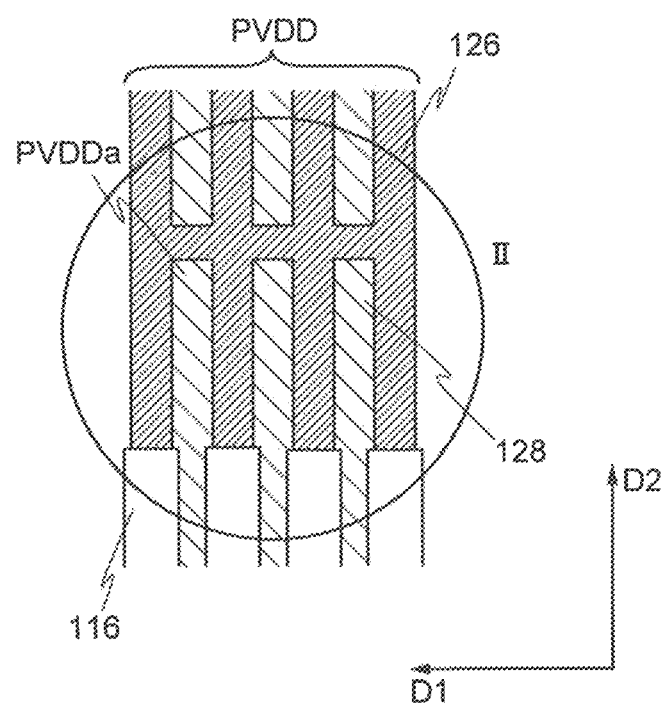
FIG. 13B is a plan view showing a structure of a wiring included in the display device in the embodiment according to the present invention.

FIG. 11 is a plan view showing a circuit configuration of the display device 300 in this embodiment. FIG. 12 is a cross-sectional view showing a structure of the display device 300 in this embodiment in a folded state. FIG. 13A and FIG. 13B are each a plan view showing a structure of the wiring 109 included in the display device 300 in this embodiment. FIG. 13A shows portion I in FIG. 11, and FIG. 13B show portion II shown in FIG. 11.

As shown in FIG. 11, the display device 300 in this embodiment has the folding area 132 defined between the display region 106 and the terminal region 114. The folding area 132 is folded in the D2 direction to fold the display device 300 (FIG. 12).

The wiring 109 located in the folding area 132 connect the plurality of connection terminals 116 and the scanning signal line driving circuit 118 to each other, and connect the plurality of connection terminals 116 and the video signal line driving circuit 120 to each other. The wiring 109 extend generally in the D2 direction. FIG. 13A and FIG. 13B each show an example of opening pattern of such a wiring 109. FIG. 13A is an enlarged view of one of the video signal lines 124. FIG. 13B is an enlarged view of a power source potential line PVDD.

These wiring each include two conductive layers, specifically, the first conductive layer 126 and the second conductive layer 128, which are located sequentially in this order from the top side. The power source potential line PVDD has a relatively large current flow therein, and therefore, may be occasionally connected commonly with a plurality of terminals among the plurality of connection terminals 116. The power source potential line PVDD is relatively thick, and thus is cracked more easily than the other wiring. In this embodiment, the power source potential line PVDD has a lattice opening pattern PVDDa.

The display device 300 having such a structure does not easily cause the wiring 109 or the insulating layer 130 to be cracked when being folded along the defined folding area 132 and thus is highly reliable.

In this embodiment, the connection terminals 116 are located on the power source potential line PVDD. The power source potential line PVDD and the connection terminals 116 are not limited to being provided in such a structure. In another example, the connection terminals 116 and the second conductive layer 128 of the power source potential line PVDD may be formed by the same patterning step. In this case, the second conductive layer 128 also acts as the connection terminals 116. Further in this case, the first conductive layer 126 may be extended to the connection terminals 116 so as to cover the connection terminals 116.

In this embodiment, the second conductive layer 128 of the power source potential line PVDD are located over the plurality of terminals adjacent to each other among the connection terminals 116 in the terminal region 114. The power source potential line PVDD and the connection terminals 116 are not limited to being located in this manner. For example, the second conductive layer 128 of the power source potential line PVDD may be divided into a plurality of wiring portions in the terminal region 114, and each of the wiring portions of the second conductive layer 128 may be respectively connected with the plurality of terminals among the connection terminals 116.

<Embodiment 4>

With reference to the figures, a structure of pixel electrodes 136 included in a display device in this embodiment will be described. The display device in this embodiment is different from the display device 100 in embodiment 1 in the structure of the pixel electrodes 136. Except for this point, the display device in this embodiment is substantially the same as the display device 100, and detailed descriptions thereof will be omitted.

Figure 14:
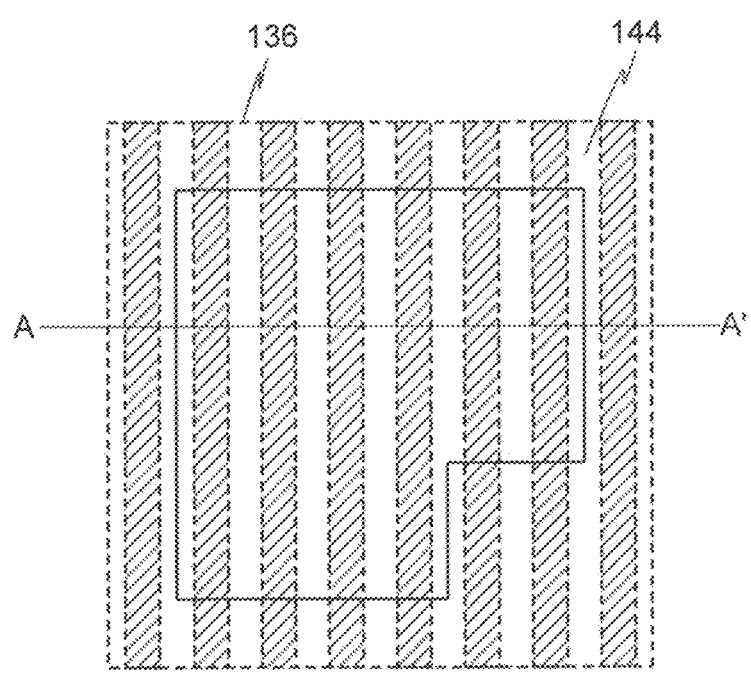
FIG. 14 is a plan view showing a structure of a pixel electrode included in a display device in an embodiment according to the present invention.
Figure 15:
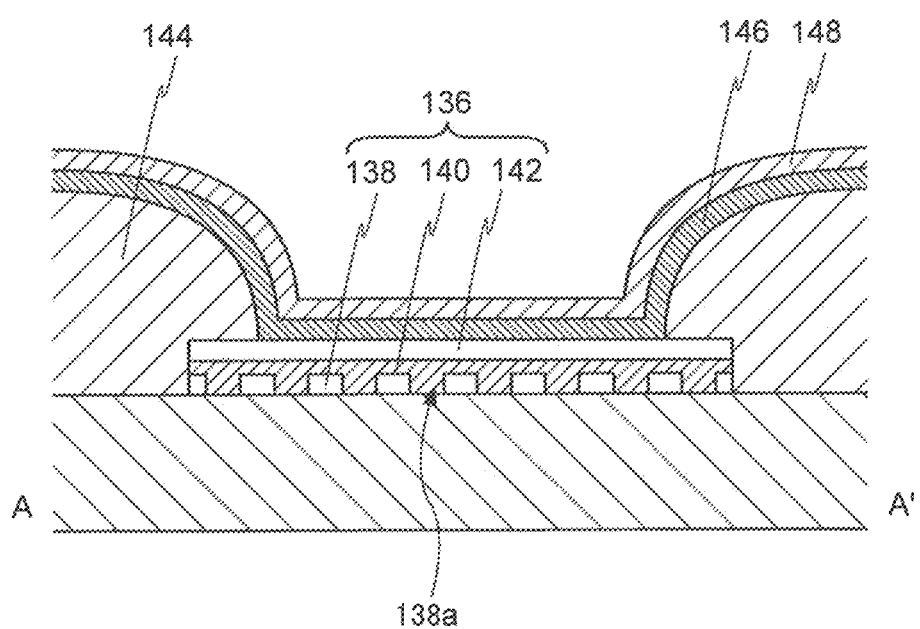
FIG. 15 is a cross-sectional view showing the pixel electrode included in the display device in the embodiment according to the present invention, taken along line A-A' in FIG. 14.

FIG. 14 is a plan view showing a structure of the pixels 108 included in the display device in this embodiment. FIG. 15 is a cross-sectional view showing the structure of the pixels 108 included in the display device in this embodiment, taken along line A-A' in FIG. 14.

The plurality of pixels 108 includes at least the selection transistor (not shown), the driving transistor (not shown), and a light-emitting element 134. The light-emitting element 134 has a stack structure including the pixel electrode 136 provided in each of the pixels 108, a light-emitting layer 146, and a common electrode 148 provided commonly to the plurality of pixels 108.

The pixel electrode 136 is provided in each of the pixels 108. The pixel electrode 136 included in the display device in this embodiment includes three conductive layers, which are a first conductive layer 138, a second conductive layer 140 and a third conductive layer 142 sequentially located from the bottom side.

The first conductive layer 138 has an opening pattern 138a. The first conductive layer 138 is not limited to having the opening pattern 138a shown in FIG. 14. For example, the first conductive layer 138 may have the opening pattern 126a shown in any of FIG. 3A through FIG. 7B.

In this embodiment, the first conductive layer 138 includes a transparent conductive layer. The transparent conductive layer contains a conductive oxide. A usable conductive oxide may be, for example, ITO (tin oxide-containing indium oxide), IZO (oxide indium-zinc oxide) or the like.

A preferable conductive oxide is amorphous, not crystalline. An amorphous conductive oxide improves the durability against cracking and against rise in the resistance at the time of folding.

The conductive oxide may contain an element having a relatively large s orbital. Examples of the element having a relatively large s orbital include aluminum (Al), silver (Ag), titanium (Ti), copper (Cu), molybdenum (Mo), tantalum (TA), tungsten (W), platinum (Pt), gold (Au) and the like.

Use of such an element increases the overlapping of s orbitals of the element. In the case where the s orbitals are isotropic, the s orbitals of the element are difficult to be separated from each other at the time of folding, which improves the durability against cracking and against rise in the resistance.

The second conductive layer 140 is located to fill the openings of the first conductive layer 138. The second conductive layer 140 is formed of a light-reflective material such as, for example, Ag (silver). Because of such a material of the second conductive layer 140, light generated in the light-emitting layer 146 is not propagated toward the first substrate 102 but is propagated toward the second substrate 104, which is on the side of a display screen.

The third conductive layer 142 is located on the second conductive layer 140. The third conductive layer 142 may be formed of substantially the same material as that of the first conductive layer 138.

A bank 144 is provided around each of the pixel electrodes 136. The bank 144 is located such that an end thereof covers a peripheral portion of the pixel electrode 136. The bank 144 prevents a situation where the light-emitting layer 146 is not sufficiently covered at the end of the pixel electrode 136 and the pixel electrode 136 is shortcircuited with the common electrode 148. The bank 144 insulates adjacent pixels 108 from each other.

The bank 144 is formed of an insulating material. An insulating material preferable for the bank 144 may be an organic material such as polyimide, acrylic resin, or an inorganic material such as silicon oxide.

The light-emitting layer 146 is provided on at least the pixel electrode 136. In this example, the light-emitting layer 146 is provided commonly for the plurality of pixels 108 so as to cover the bank 144 between the pixels 108.

The light-emitting layer 146, in the case of being formed of, for example, an organic EL material, is formed of a low molecular weight type organic material or a high molecular weight type organic material. In the case where a low molecular weight type organic material is used to form the light-emitting layer 146, for example, a hole injection layer/hole transfer layer and an electron transfer layer/electron injection layer are provided to sandwich the light-emitting layer 146, which contains a light-emitting organic material.

In this embodiment, the light-emitting layer 146 is formed of a material emitting white light, and full color display is realized by color filters.

The common electrode 148 is provided on the light-emitting layer 146. The common electrode 148 is formed of a light-transmissive material in order to allow light emitted in the light-emitting layer 146 to be transmitted through the common electrode 148. It is preferable that the common electrode 148 is formed of a transparent conductive material, which is light-transmissive and conductive, such as ITO (tin oxide-containing indium oxide), IZO (indium oxide-zinc oxide). Alternatively, the common electrode 148 may be formed of a metal layer having such a thickness that allows the light emitted in the light-emitting layer 146 to be transmitted through the metal layer.

Below the light-emitting element 134, a driving circuit (not shown) including transistors, wiring and the like that are provided to control light emission in each of the plurality of pixels 108 and an insulating film (not shown) covering the transistors, the wiring and the like are provided.

The structure of the pixel electrodes 136 included in the display device in this embodiment is described above. The display device having such a structure improves the durability of the pixel electrodes 136 against folding.

Preferable embodiments of the present invention are described by way of embodiments 1 through 4. These embodiments are merely examples, and the technological scope of the present invention is not limited to any of the embodiments. A person of ordinary skill in the art would make various alterations without departing from the gist of the present invention. Therefore, such alterations are to be construed to be encompassed in the technological scope of the present invention.

What is claimed is:

1. A display device, comprising:
   a flexible substrate;
   a plurality of pixels arrayed on the substrate; and
   a wiring, provided on the substrate, transmitting a signal that drives the plurality of pixels;
   wherein the wiring includes a first conductive layer having an opening pattern at least in a partial area of the wiring, and
   the opening pattern includes a first opening group having a plurality of openings arranged in a first direction in which the wiring extends.

2. The display device according to claim 1, wherein
   the opening pattern includes a second opening group having a plurality of openings arranged in the first direction, and
   the second opening group is adjacent in a second direction crossing the first direction.

3. The display device according to claim 2, wherein
   at least two pairs of the first opening group and the second opening group are arranged in a second direction.

4. The display device according to claim 1, wherein
   the first opening group includes a first opening,
   the second opening group includes a second opening,
   the first opening and the second opening are arranged adjacent to each other in the second direction in plan view,
   the first conductive layer has a lattice pattern in which the first opening and the second opening are arranged in at least a partial area of the wiring.

5. The display device according to claim 1, wherein
   a first opening included in the first opening group and a second opening included in the second opening group adjacent to the nearest distance to the first opening are located at the different position within a range of a length of the first opening in the first direction of the wiring extends in plan view.

6. The display device according to claim 1, wherein
   the wiring further includes a second conductive layer located below the first conductive layer, and
   the second conductive layer is formed of a conductive metal material.

7. The display device according to claim 6, wherein
   the second conductive layer overlaps the plurality openings included in the first opening group of the first conductive layer.

8. The display device according to claim 6, wherein
   the first conductive layer includes a transparent conductive layer.

9. The display device according to claim 8, wherein
   the transparent conductive layer contains a conductive oxide.

10. The display device according to claim 9, wherein
    the conductive oxide comprises an amorphous material.

11. The display device according to claim 1, wherein
    the flexible substrate has a folding area, and
    the first opening group is arranged in the folding area.

* * * * *